United States Patent
Li et al.

(10) Patent No.: US 12,446,413 B2
(45) Date of Patent: Oct. 14, 2025

(54) DISPLAY PANEL AND FABRICATION METHOD THEREOF

(71) Applicants: HUIZHOU CHINA STAR OPTOELECTRONICS DISPLAY CO., LTD., Guangdong (CN); Shenzhen China Star Optoelectronics Semiconductor Display Technology Co., Ltd., Guangdong (CN)

(72) Inventors: Caiwen Li, Guangdong (CN); Shijian Qin, Guangdong (CN)

(73) Assignees: HUIZHOU CHINA STAR OPTOELECTRONICS DISPLAY CO., LTD., Guangdong (CN); SHENZHEN CHINA STAR OPTOELECTRONICS SEMICONDUCTOR DISPLAY CO., LTD., Guangdong (CN)

( * ) Notice: Subject to any disclaimer, the term of this patent is extended or adjusted under 35 U.S.C. 154(b) by 0 days.

(21) Appl. No.: 17/597,209

(22) PCT Filed: Dec. 20, 2021

(86) PCT No.: PCT/CN2021/139597
§ 371 (c)(1),
(2) Date: Dec. 29, 2021

(87) PCT Pub. No.: WO2023/103071
PCT Pub. Date: Jun. 15, 2023

(65) Prior Publication Data
US 2024/0040856 A1    Feb. 1, 2024

(30) Foreign Application Priority Data
Dec. 9, 2021 (CN) .......................... 202111500828.X

(51) Int. Cl.
*H10K 59/124* (2023.01)
*H10K 59/12* (2023.01)
(Continued)

(52) U.S. Cl.
CPC ....... *H10K 59/124* (2023.02); *H10K 59/1201* (2023.02); *H10K 77/111* (2023.02); *H10K 2102/311* (2023.02)

(58) Field of Classification Search
None
See application file for complete search history.

(56) References Cited

U.S. PATENT DOCUMENTS 5,587,589 A * 12/1996 So ........................ H10K 59/17
257/40
10,665,721 B1 5/2020 Liu
(Continued)

FOREIGN PATENT DOCUMENTS

CN    109037477 A    12/2018
CN    109192878 A    1/2019
(Continued)

OTHER PUBLICATIONS

WO-2019144734-A1, machine translation (Year: 2019).*
(Continued)

*Primary Examiner* — Bo B Jang

(57) ABSTRACT

The application discloses a display panel and a fabrication method thereof. The display panel includes a flexible substrate. The flexible substrate includes a first organic insulating layer, a first barrier layer, a second organic insulating layer, and a second barrier layer. The first barrier layer, the second organic insulating layer and the second barrier layer are sequentially stacked on the first organic insulating layer. The first barrier layer is provided with a plurality of grooves on a side away from the first organic insulating layer. A
(Continued)

thickness of the grooves accounts for 25%-55% of a thickness the first barrier layer.

20 Claims, 6 Drawing Sheets

(51) Int. Cl.
    *H10K 77/10*         (2023.01)
    *H10K 102/00*      (2023.01)

(56) References Cited

U.S. PATENT DOCUMENTS

| | | | |
|---|---|---|---|
| 2016/0064464 A1 | | 3/2016 | Namkung et al. |
| 2021/0083020 A1 | | 3/2021 | Zhou et al. |
| 2021/0328158 A1 | * | 10/2021 | Kang .................. H10K 77/111 |

FOREIGN PATENT DOCUMENTS

| | | | | | |
|---|---|---|---|---|---|
| CN | 208722882 U | | 4/2019 | | |
| CN | 110085740 A | | 8/2019 | | |
| CN | 110752230 A | | 2/2020 | | |
| CN | 111029479 A | * | 4/2020 | ............. | H10K 50/80 |
| CN | 112864180 A | | 5/2021 | | |
| WO | WO-2019144734 A1 | * | 8/2019 | ......... | H01L 51/0018 |

OTHER PUBLICATIONS

CN-111029479-A, machine translation (Year: 2020).*
Machine translation of CN111029479 (Year: 2020).*
Chinese Office Action issued in corresponding Chinese Patent Application No. 202111500828.X dated Jan. 20, 2025, pp. 1-11.

* cited by examiner

DISPLAY PANEL AND FABRICATION METHOD THEREOF

FIELD OF INVENTION

The present application relates to a display technology field, and particularly to a display panel and a fabrication thereof.

BACKGROUND

At present, a substrate in current flexible devices is usually a flexible substrate. The flexible substrate is usually formed by alternately stacking organic and inorganic layers. However, a stress tends to concentrate during a bending process of the flexible substrate, which leads to problems of cracking or peeling of the flexible substrate, thereby affecting the performance of the flexible substrate.

SUMMARY OF DISCLOSURE

The embodiments of the present application provide a display panel and a fabrication method thereof to solve problems of film peeling of a flexible substrate in the prior art.

An embodiment of the present application provides a display panel, comprising:
a flexible substrate; and
a transistor layer, wherein the transistor layer is disposed on the flexible substrate;
wherein the flexible substrate comprises:
a first organic insulating layer;
a first barrier layer, wherein the first barrier layer is disposed on the first organic insulating layer, and a plurality of grooves are provided on a side of the first barrier layer away from the first organic insulating layer, and a thickness of the plurality of grooves accounts for 25%-55% of a thickness of the first barrier layer;
a second organic insulating layer, wherein the second organic insulating layer is disposed on the first barrier layer and extending into the plurality of grooves; and
a second barrier layer, wherein the second barrier layer is disposed on the second organic insulating layer.

Optionally, in some embodiment of the present application, the first barrier layer is provided with a center region and edge regions provided on both sides of the center region, and a density of the grooves in the center region is greater than a density of the grooves located in the edge regions.

Optionally, in some embodiment of the present application, a groove diameter of the grooves in the center region is smaller than a groove diameter of the grooves located in the edge region.

Optionally, in some embodiment of the present application, each of the grooves comprises a first groove diameter and a second groove diameter that are arranged oppositely, and the first groove diameter is located on a side of the grooves near the organic insulating layer, the second groove diameter is located on a side of the groove away from the first organic insulating layer, and the first groove diameter is larger than the second groove diameter.

Optionally, in some embodiment of the present application, at least one of the first barrier layer and the second barrier layer is made of a water and oxygen barrier material, and the water and oxygen barrier material comprises alumina.

Optionally, in some embodiment of the present application, the plurality of grooves are disposed on the first barrier layer in an array.

Optionally, in some embodiment of the present application, the plurality of grooves extend in a first direction, and the plurality of grooves are arranged in a second direction, and each of the plurality of grooves comprises a first sub-groove and a second sub-groove, the first sub groove extends in a third direction, the second sub-groove extends in a fourth direction, an end of the first sub-groove is connected to an end of the second sub-groove, and the fourth direction, the third direction and the second direction intersect with the first direction.

Optionally, in some embodiment of the present application, the plurality of grooves comprise a first groove and a second groove, the first groove extends along a first direction, and the second groove extends along a second direction, and the first direction intersects the second direction.

Optionally, in some embodiment of the present application, the transistor layer comprises a light shielding layer, a buffer layer, an active layer, a gate insulating layer, a gate electrode, a source and drain electrode, an interlayer dielectric layer, a passivation layer, and a planarization layer, the light-shielding layer is disposed on the second barrier layer, the buffer layer covers the light-shielding layer and the second barrier layer, the active layer is disposed on the buffer layer and is located on the light-shielding layer, the gate insulating layer is disposed on the active layer, the gate is disposed on the gate insulating layer, and the interlayer dielectric layer covers the buffer layer and the active layer, the source layer, the gate insulating layer and the gate, the source and drain are disposed on the interlayer dielectric layer and connected to a conductor part of the active layer, and the passivation layer covers the source and drain electrode and the interlayer dielectric layer, and the planarization layer is disposed on the passivation layer.

Optionally, in some embodiment of the present application, the display panel further comprises an electrode layer, a pixel definition layer, and a light-emitting layer, the electrode layer is disposed on the planarization layer, and the electrode layer is connected to the source and drain electrode, the pixel defining layer is disposed on the planarization layer and the electrode layer, the light emitting layer is disposed on the pixel defining layer, and the light emitting layer is connected to the electrode layer.

In addition, the present application further provides a fabrication method of a display panel, comprising:
providing a first organic insulating layer;
forming a water and oxygen barrier material on the first organic insulating layer, the barrier material is patterned to form a first barrier layer, a plurality of grooves are provided on a side of the first barrier layer away from the first organic insulating layer, and a thickness of fabrication method accounts for 25%-55% of a thickness of the first barrier layer;
forming a second organic insulating layer on the first barrier layer;
disposing a water and oxygen barrier material on the second organic insulating layer to form a second barrier layer; and
forming a transistor layer on the second barrier layer.

Optionally, in some embodiment of the present application, the first barrier layer is provided with a center region and edge regions arranged on both sides of the center region, and a density of the grooves in the center region is greater than a density of the grooves located in the edge regions.

Optionally, in some embodiment of the present application, before providing the first organic insulating layer, further comprising:

providing a glass substrate, and forming a sacrificial layer on the glass substrate.

Optionally, in some embodiment of the present application, after forming a transistor layer on the second barrier layer, further comprising:

forming an electrode layer on the planarization layer;
forming a pixel definition layer on the electrode layer; and
forming a light-emitting layer on the pixel defining layer, and the light-emitting layer is connected to the electrode layer.

Optionally, in some embodiment of the present application, the water and oxygen barrier material comprises alumina.

Optionally, in some embodiment of the present application, each of the grooves comprises a first groove diameter and a second groove diameter that are arranged oppositely, and the first groove diameter is located on the side of the groove near the first organic insulating layer, the second groove diameter is located on a side of the groove away from the first organic insulating layer, and the first groove diameter is larger than the second groove diameter.

Optionally, in some embodiment of the present application, the grooves are disposed on the first barrier layer in an array.

Optionally, in some embodiment of the present application, the plurality of grooves extend in a first direction, and the plurality of grooves are arranged in a second direction, and each of the plurality of grooves comprises a first sub-groove and a second sub-groove, the first sub groove extends in a third direction, the second sub-groove extends in a fourth direction, an end of the first sub-groove is connected to an end of the second sub-groove, and the fourth direction, the third direction and the second direction intersect with the first direction.

Optionally, in some embodiment of the present application, the plurality of grooves comprise a first groove and a second groove, the first groove extends along a first direction, and the second groove extends along a second direction, and the first direction intersects the second direction.

Optionally, in some embodiment of the present application, the groove diameter of the groove located in the center region is smaller than the groove diameter of the groove located in the edge regions.

The present application discloses a display panel and a fabrication method thereof. The display panel comprises a flexible substrate and a transistor layer. The transistor layer is disposed on the flexible substrate, wherein the flexible substrate comprises a first organic insulating layer, a first barrier layer, a second organic insulating layer, and the second barrier layer. The first barrier layer is disposed on the first organic insulating layer, and a plurality of grooves are provided on a side of the first barrier layer away from the first organic insulating layer. A thickness of the grooves accounts for 25%-55% of the thickness of the first barrier layer. The second organic insulating layer is provided on the first barrier layer and extends into the grooves. The second barrier layer is disposed on the second organic insulating layer. In the present application, grooves are provided on the first barrier layer, and a thickness d of the groove is set to account for 25%-55% of a thickness of the first barrier layer to prevent the problem of cracking occurs during a bending process of the flexible substrate, thereby improving the performance of the display panel.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
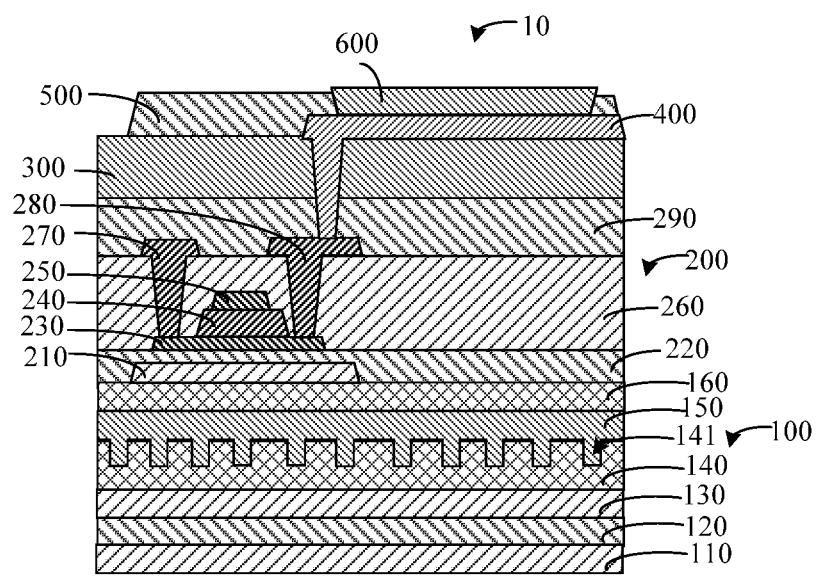
FIG. 1 is a schematic structural diagram of a display panel provided by an embodiment of the present application.

The following will clearly and completely describe the technical solutions in the embodiments of the present application in conjunction with the drawings in the embodiments of the present application. Obviously, the described embodiments are only a part of the embodiments of the present application, rather than all of the embodiments. Based on the embodiments in this application, all other embodiments obtained by those skilled in the art without creative work shall fall within the protection scope of this application. In addition, it should be understood that the specific implementations described here are only used to illustrate and explain the application, and are not used to limit the application. In this application, if no explanation is made to the contrary, the orientation words used such as "upper" and "lower" generally refer to the upper and lower directions of the device in actual use or working state, and specifically refer to the drawing directions in the drawings; And "inner" and "outer" refer to the outline of the device. In this application, "reaction" can be a chemical reaction or a physical reaction.

The present application discloses a display panel and a fabrication method thereof. The display panel comprises a flexible substrate and a transistor layer. The transistor layer is disposed on the flexible substrate, wherein the flexible substrate comprises a first organic insulating layer, a first barrier layer, a second organic insulating layer, and the second barrier layer. The first barrier layer is disposed on the first organic insulating layer, and a plurality of grooves are provided on a side of the first barrier layer away from the first organic insulating layer. A thickness of the grooves accounts for 25%-55% of the thickness of the first barrier layer. The second organic insulating layer is provided on the first barrier layer and extends into the grooves. The second barrier layer is disposed on the second organic insulating layer.

In the present application, grooves are provided on the first barrier layer, and a thickness d of the groove is set to account for 25%-55% of a thickness of the first barrier layer to prevent the problem of cracking occurs during a bending process of the flexible substrate, and increase the contact area between the first barrier layer and the second organic insulating layer at the same time, thereby improving the performance of the display panel.

Figure 2:
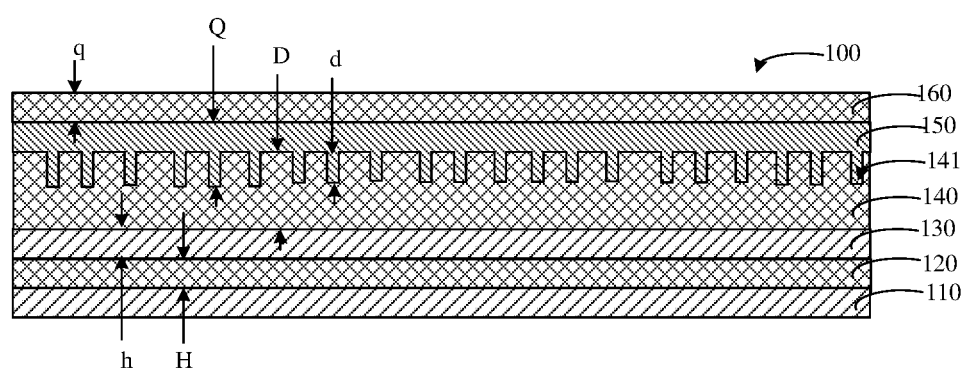
FIG. 2 is a first structural schematic diagram of the flexible substrate in FIG. 1 provided by an embodiment of the present application.

Detailed Descriptions are as Follows:

Please refer to FIGS. 1-2, FIG. 1 is a schematic structural diagram of a display panel provided by an embodiment of the present application, and FIG. 2 is a first structural schematic diagram of the flexible substrate in FIG. 1 provided by an embodiment of the present application. The application provides a display panel 10. The display panel 10 comprises a flexible substrate 100 and a transistor layer 200. Herein, the flexible substrate 100 comprises a first organic insulating layer 130, a first barrier layer 140, a second organic insulating layer 150, and a second barrier layer 160.

In an embodiment, the display panel 10 further comprises a glass substrate 110 and a sacrificial layer 120. The sacrificial layer 120 is disposed on the glass substrate 110. A material of the sacrificial layer 120 is amorphous silicon. A thickness H of the sacrificial layer 120 is angstroms. Specifically, the thickness H of the sacrificial layer 120 may be 20 angstroms, 26 angstroms, 30 angstroms, 40 angstroms, 50 angstroms, or the like. The sacrificial layer 120 is formed of amorphous silicon, and the thickness H of the sacrificial layer 120 is set to 20-50 angstroms to avoid the problem of uneven peeling of the flexible substrate 100 during a subsequent peeling, thereby improving a performance of the flexible substrate 100.

The first organic insulating layer 130 is disposed on the sacrificial layer 120. A material of the first organic insulating layer 130 is a flexible material. The flexible material includes polyimide.

In one embodiment, a thickness h of the first organic insulating layer 130 is 8-10 microns. Specifically, the thickness h of the first organic insulating layer 130 may be 8 micrometers, 8.3 micrometers, 9 micrometers, 9.6 micrometers, 10 micrometers, or the like. Setting the thickness h of the first organic insulating layer 130 to be 8-10 microns improves the bending performance of the flexible substrate 100, thereby improving the performance of the display panel 10.

The first barrier layer 140 is disposed on the first organic insulating layer 130. A plurality of grooves 141 are provided on a side of the first barrier layer 140 away from the first organic insulating layer 130. A thickness d of the groove 141 accounts for 25%-55% of a thickness D of the first barrier layer 140. Specifically, the thickness d of the groove 141 may account for 25%, 30%, 40%, 45%, or 55% of the thickness D of the first barrier layer 140.

In the present application, the thickness d of the groove 141 is set to account for 25%-55% of the thickness D of the first barrier layer 140, which further increases a contact area between the first barrier layer 140 and the subsequent second organic insulating layer 150, thereby further improving an adhesion between the first barrier layer 140 and the second organic insulating layer, and further avoiding the problem of cracking of the flexible substrate 100 due to stress concentration during the bending process of the flexible substrate 100, thereby the performance of the flexible substrate 100 is further improved.

Figure 3:
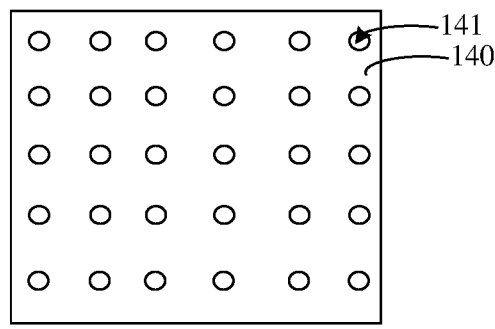
FIG. 3 is a schematic diagram of a first planar structure of a first barrier layer provided by an embodiment of the present application.

Please refer to FIG. 3, which is a schematic diagram of a first planar structure of the first barrier layer provided by an embodiment of the present application. An array of the grooves 141 is disposed on the first barrier layer 140, that is, every two adjacent grooves 141 do not penetrate each other. In the present application, the first barrier layer 140 is provided with grooves 141 arranged in an array to increase the contact area between the first barrier layer 140 and the subsequent second organic insulating layer 150, thereby increasing the adhesion between the first barrier layer 140 and the second organic insulating layer 150, and preventing the flexible substrate 100 from cracking due to stress concentration during a bending process, thereby preventing water and oxygen from invading the flexible substrate 100 and improving the performance of the flexible substrate 100.

In an embodiment, a material of the first barrier layer 140 is a water and oxygen barrier material. The water and oxygen barrier material comprises one or a combination of aluminum oxide, silicon nitride, and silicon oxide. In the present application, the first barrier layer 140 is formed of a water and oxygen barrier material, which can prevent moistures from entering the display panel 10, thereby improving the performance of the display panel 10.

Please continue to refer to FIG. 2. In one embodiment, a thickness D of the first barrier layer 140 is 4000-5000 angstroms. Specifically, the thickness D of the first barrier layer 140 may be 4000 angstroms, 4200 angstroms, 4600 angstroms, 4800 angstroms, 5000 angstroms, or the like. In the present application, the thickness D of the first barrier layer 140 is set to 4000-5000 angstroms, which can further prevent moistures from entering the display panel 10, thereby further improving the performance of the display panel 10.

The second organic insulating layer 150 is disposed on the first barrier layer 140 and extends into the grooves 141.

In an embodiment, a material of the second organic insulating layer 150 is a flexible material. The flexible material includes polyimide.

In one embodiment, a thickness Q of the second organic insulating layer 150 is 8-10 microns. Specifically, the thickness Q of the second organic insulating layer 150 may be 8 micrometers, 8.3 micrometers, 9 micrometers, 9.6 micrometers, 10 micrometers, or the like. Setting the thickness Q of the second organic insulating layer 150 to 8-10 microns improves the bending performance of the flexible substrate 100, thereby improving the performance of the display panel 10.

The second barrier layer 160 is disposed on the second organic insulating layer 150. A material of the second barrier layer 160 is a water and oxygen barrier material. The water and oxygen barrier material is alumina. In the present application, the second barrier layer 160 is formed of aluminum oxide, which can prevent moistures and hydrogen ions from entering the display panel 10, and improve the uniformity of the second barrier layer 160, thereby ensuring the performance of the display panel 10. If silicon nitride or silicon oxide is used to form the second barrier layer 160, since silicon nitride or silicon oxide has a weak ability to block moistures and hydrogen ions, it is easy to cause moistures and hydrogen ions to invade the display panel 10, thereby affecting the performance of the display panel 10.

In an embodiment, a thickness q of the second barrier layer 160 is 4000-5000 angstroms. Specifically, the thickness q of the second barrier layer 160 may be 4000 angstroms, 4200 angstroms, 4600 angstroms, 4800 angstroms, 5000 angstroms, or the like. In the present application, the thickness q of the second barrier layer 160 is set to 4000-5000 angstroms, which can further prevent moistures from entering the display panel 10, thereby further improving the performance of the display panel 10.

The first organic insulating layer 130, the first barrier layer 140, the second organic insulating layer 150, and the second barrier layer 160 constitute the flexible substrate 100.

Please continue to refer to FIG. 1, the transistor layer 200 comprises a light shielding layer 210, a buffer layer 220, an active layer 230, a gate insulating layer 240, a gate 250, source and drain electrodes 270 and 280, an interlayer dielectric layer 260, a passivation layer 290, and a planarization layer 300. The light shielding layer 210 is disposed on the second barrier layer 160. The buffer layer 220 covers the light shielding layer 210 and the second blocking layer 160. The active layer 230 is disposed on the buffer layer 220 and on the light shielding layer 210. The gate insulating layer 240 is disposed on the active layer 230. The gate 250 is disposed on the gate insulating layer 240. The interlayer dielectric layer 260 covers the buffer layer 220, the active layer 230, the gate insulating layer 240, and the gate 250. The source and drain electrodes 270 and 280 are disposed on the interlayer dielectric layer 260 and are connected to the conductor portion of the active layer 230 through via holes. The passivation layer 290 covers the source and drain electrodes 270 and 280 and the interlayer dielectric layer 260. The planarization layer 300 is disposed on the passivation layer 290.

In an embodiment, the display panel further comprises an electrode layer 400, a pixel definition layer 500, and a light-emitting layer 600. The electrode layer 400 is disposed on the planarization layer 300 and is connected to the source and drain electrodes 270 and 280 through via holes. The pixel definition layer 500 is disposed on the planarization layer 300 and the electrode layer 400. The light-emitting layer 600 is disposed on the pixel definition layer 500 and is connected to the electrode layer 400 through a connection hole.

Figure 4:
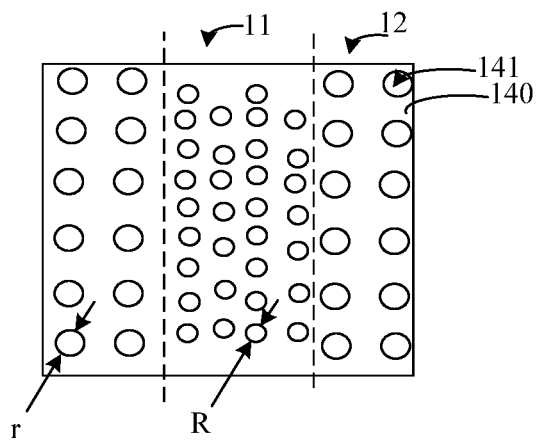
FIG. 4 is a schematic diagram of a second planar structure of a first barrier layer provided by an embodiment of the present application.

Please refer to FIG. 4, which is a schematic diagram of a second planar structure of the first barrier layer provided by an embodiment of the present application. It should be noted that the difference between the second planar structure schematic diagram and the first planar structure schematic diagram is:

The first barrier layer 140 is provided with a center region 11 and edge regions 12 arranged on both sides of the center region 11, and a density of the grooves 141 in the center region 11 is greater than a density of the grooves 141 in the edge regions 12. The other structure is the same as that of FIG. 3, and will not be repeated here.

In the present application, the density of the grooves 141 in the center region 11 is set to be greater than the density of the grooves 141 in the edge region 12, which further increases the contact area between the first barrier layer 140 and the second organic insulating layer 150, thereby further improving the adhesion between the first barrier layer 140 and the second organic insulating layer, and further preventing the flexible substrate 100 from cracking due to stress concentration during a bending process, thereby further improving the performance of the flexible substrate 100.

In one embodiment, a groove diameter R of the grooves 141 in the center region 11 is smaller than the groove diameter r of the grooves 141 in the edge region 12.

It should be noted that the groove diameter here refers to a planar diameter of the groove, that is, a diameter of an opening.

In the present application, the groove diameter R of the groove 141 in the center region 11 is set to be smaller than the groove diameter r of the groove 141 in the edge region 12, which further improves the contact area between the first barrier layer 140 and the second organic insulating layer 150, thereby further improving the adhesion between the first barrier layer 140 and the second organic insulating layer, and further avoiding the problem of cracking of the flexible substrate 100 due to stress concentration during a bending process of the flexible substrate 100, and thereby further improving the performance of the flexible substrate 100.

Figure 5:
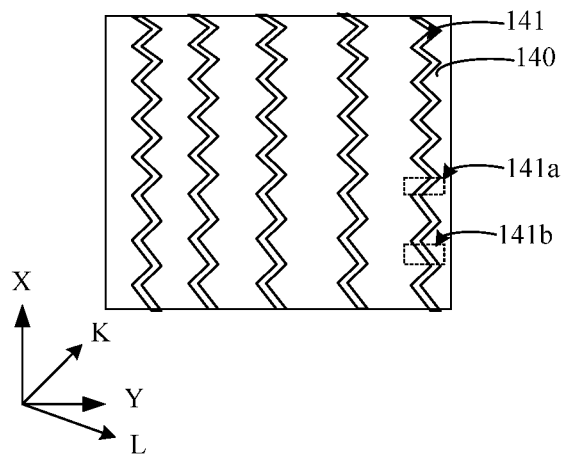
FIG. 5 is a schematic diagram of a third planar structure of a first barrier layer provided by an embodiment of the present application.

Please refer to FIG. 5, which is a schematic diagram of a third planar structure of the first barrier layer provided by an embodiment of the present application. It should be noted that the difference between the third planar structure diagram and the first planar structure diagram is:

The grooves 141 extend along a first direction X, and the grooves 141 are arranged along a second direction Y, and the second direction Y intersects the first direction X. The groove 141 comprises a first sub-groove 141*a* and a second sub-groove 141*b*. The first sub-groove 141*a* extends along a third direction K, and the second sub-groove 141*b* extends along a fourth direction L. Ends of the first sub-groove 141*a* and the second sub-groove 141*b* are connected, and the third direction K, the fourth direction L, and the second direction Y intersect the first direction X. The other structure is the same as that of FIG. 3, and will not be repeated here.

In the present application, the grooves 141 extend along the first direction X, and the grooves 141 are arranged along the second direction Y, the second direction Y intersects the first direction X, and the groove 141 comprises a first sub-groove 141*a* and a second sub-groove 141*b*, the first divided groove 141*a* extends along the third direction K, the second divided groove 141*b* extends along the fourth direction L, and an end of the first divided groove 141*a* is connected with an end of the second sub-groove 141*b*, which simplifies a process of the display panel 10 and reduces the cost thereof.

It should be noted that an angle between the third direction K and the fourth direction L is greater than 0 degrees and less than 180 degrees. For example, the angle between the third direction K and the fourth direction L can be 120 degrees, 90 degrees, 60 degrees or 30 degrees and the like.

Figure 6:
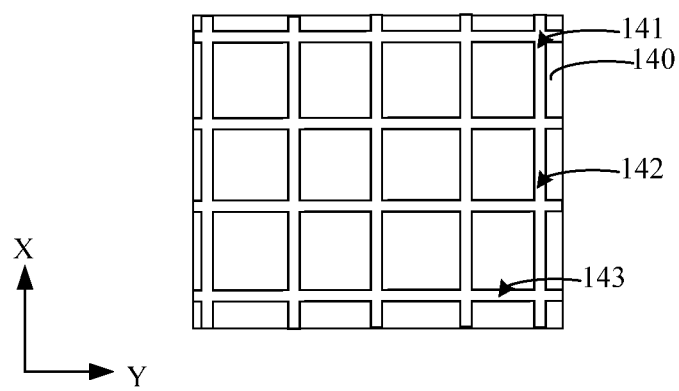
FIG. 6 is a schematic diagram of a fourth planar structure of a first barrier layer provided by an embodiment of the present application.

Please refer to FIG. 6, which is a schematic diagram of a fourth planar structure of the first barrier layer provided by an embodiment of the present application. It should be noted that the difference between the fourth planar structure schematic diagram and the first planar structure schematic diagram is:

The groove 141 comprises a first groove 142 and a second groove 143. The first groove 142 extends along the first direction X, and the second groove 143 extends along the second direction Y, and the first direction X and the second direction Y are intersected. The other structure is the same as that of FIG. 3, and will not be repeated here.

In the present application, the first groove 142 is arranged to extend along the first direction X, and the second groove 143 is arranged to extend along the second direction Y. The first direction X and the second direction Y are intersected, thereby increasing a contact area between the second insulating layer and the first barrier layer 140, so as to avoid the problem of peeling and cracking, while simplifying the process of the display panel 10 and reducing the cost thereof.

It should be noted that the angle between the first direction X and the second direction Y is greater than 0 degrees and less than 180 degrees. For example, the angle between the first direction X and the second direction Y can be 90 degrees, 60 degrees, or 30 degrees and the like.

Figure 7:
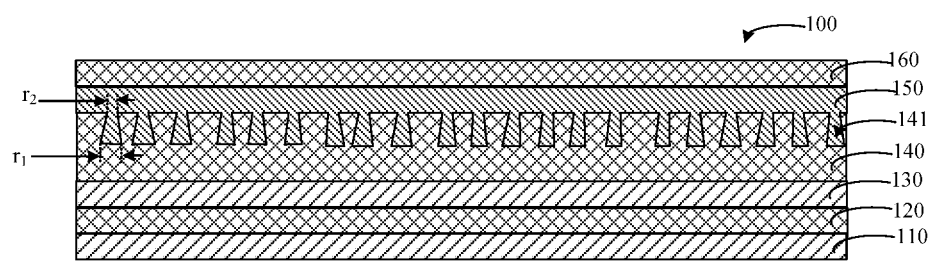
FIG. 7 is a second structural schematic diagram of the flexible substrate in FIG. 1 provided by an embodiment of the present application.

Please refer to FIG. 7, FIG. 7 is a second structural schematic diagram of the flexible substrate in FIG. 1 provided by an embodiment of the present application. It should be noted that the difference between the second structural schematic diagram and the first structural schematic diagram is:

Each groove 141 comprises a first groove diameter $r_1$ and a second groove diameter $r_2$ disposed oppositely. The first groove diameter $r_1$ is located on a side of the groove 141 close to the first organic insulating layer 130, and the second groove diameter $r_2$ is located on a side of the first organic insulating layer 130 away from the groove 141. The first groove diameter $r_1$ is larger than the second groove diameter $r_2$. The other structure is the same as that of FIG. 2 and will not be repeated here.

In the present application, setting the first groove diameter $r_1$ to be greater than the second groove diameter $r_2$ improves the adhesion between the first barrier layer 140 and the second organic insulating layer 150, thereby further avoiding a problem of peeling between the first barrier layer 140 and the second organic insulating layer 150, thereby ensuring the performance of the display panel 10.

This application also provides a fabrication method of a display panel, comprising:

Step B11: providing a first organic insulating layer.

Step B12: forming a water and oxygen barrier material formed on the first organic insulating layer, and the barrier material is patterned to form a first barrier layer, a plurality of grooves are provided on a side of the first barrier layer away from the first organic insulating layer, and a thickness of the grooves accounts for 25%-55% of a thickness of the first barrier layer.

Step B13: forming a second organic insulating layer on the first barrier layer.

Step B14: disposing a water and oxygen barrier material on the second organic insulating layer to form a second barrier layer.

Step B15: forming a transistor layer on the second barrier layer.

In the present application, the grooves are provided on the first barrier layer, and the thickness of the grooves accounts for 25%-55% of the thickness of the first barrier layer to avoid the problem of cracking of the flexible substrate during the bending process, thereby improving the performance of the display panel.

Figure 8:
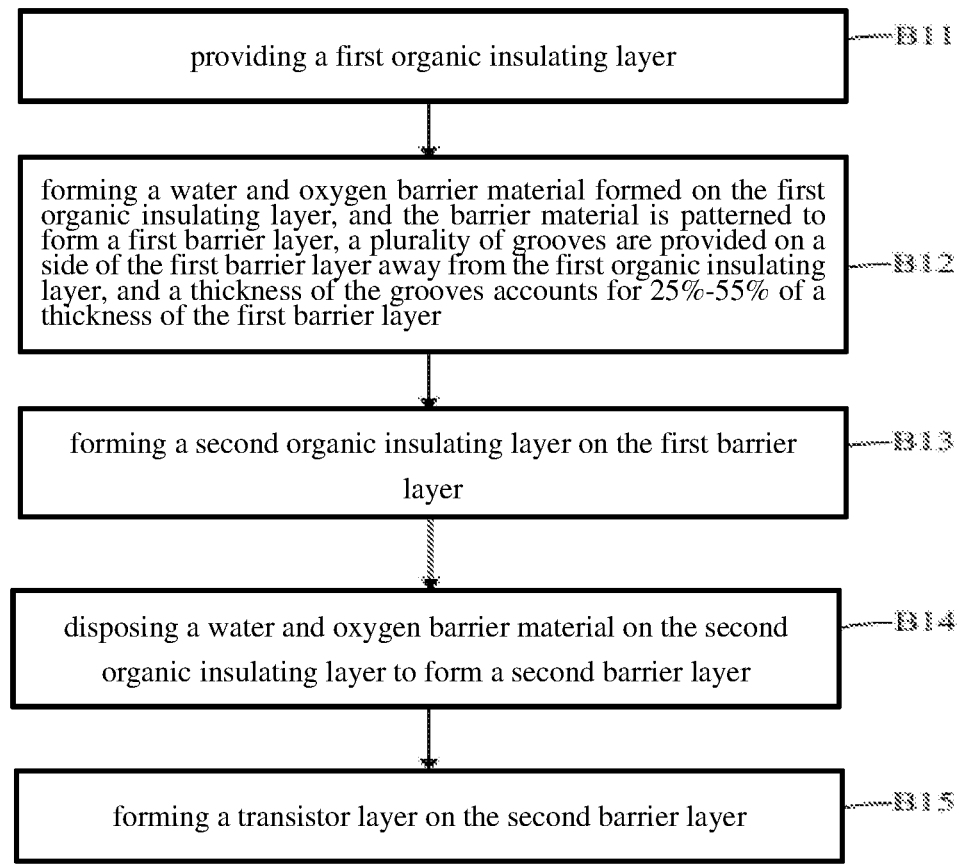
FIG. 8 is a schematic flowchart of a fabrication method of a display panel provided by an embodiment of the present application.
Figure 9:
FIGS. 9-14 are structural schematic diagrams of the fabrication method of the display panel provided by an embodiment of the present application.

The Specific Description is as Follows:

Please refer to FIG. 8 and FIGS. 9-14. FIG. 8 is a schematic flow chart of a fabrication method of a display panel provided by an embodiment of the present application, and FIGS. 9-14 are schematic diagrams of a fabrication method of a display panel provided by an embodiment of the present application. The present application provides a fabrication method of the display panel 10, comprising:

In an embodiment, before step B11, the method further comprises:

Refer to FIG. 9, a glass substrate 110 is provided, and a sacrificial layer 120a is grown on the glass substrate 110.

Step B11: providing a first organic insulating layer.

Figure 10:

Refer to FIG. 10, a coater is used to perform a front-surface coating of the first organic insulating layer 130 to form a first organic insulating layer 130 on the sacrificial layer 120, and the first organic insulating layer 130 is baked and cured to form the first organic insulating layer 130.

Step B12: forming a water and oxygen barrier material on the first organic insulating layer, and the barrier material is patterned to form a first barrier layer. A plurality of grooves are provided on a side of the first barrier layer away from the first organic insulating layer. A thickness of the grooves accounts for 25%-55% of a thickness of the first barrier layer.

Figure 11:
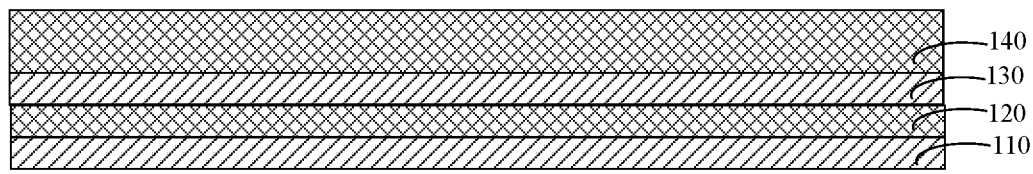

Refer to FIG. 11, a chemical deposition coating method is used on the first organic insulating layer 130 to deposit a water and oxygen barrier material. Then, the water and oxygen barrier material is exposed, developed, and etched using a photomask, such as dry-etching holes, to patterning and forming grooves in of the water and oxygen barrier material to form the first barrier layer 140 with the grooves 141. A thickness d of the groove 141 accounts for 25%-55% of a thickness D of the first barrier layer 140. Specifically, the thickness d of the groove 141 may account for 25%, 30%, 40%, 45%, or 55% of the thickness D of the first barrier layer 140. In the present application, the thickness d of the groove 141 is set to account for 25%-55% of the thickness D of the first barrier layer 140, which further increases the contact area between the first barrier layer 140 and the subsequent second organic insulating layer 150, thereby further improving the adhesion between the first barrier layer 140 and the second organic insulating layer, and further avoiding the problem of cracking of the flexible substrate 100 due to stress concentration during the bending process of the flexible substrate 100, thereby further improving the performance of the flexible substrate 100.

Step B13: forming a second organic insulating layer on the first barrier layer.

Figure 12:
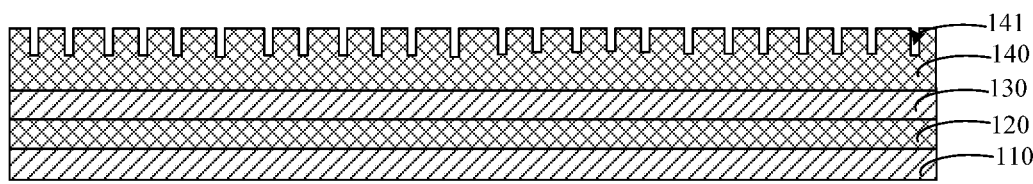

Refer to FIG. 12, an insulating layer material is coated on the first barrier layer 140 and baked to form the second organic insulating layer 150.

Step B14: disposing a water and oxygen barrier material on the second organic insulating layer to form a second barrier layer.

Figure 13:
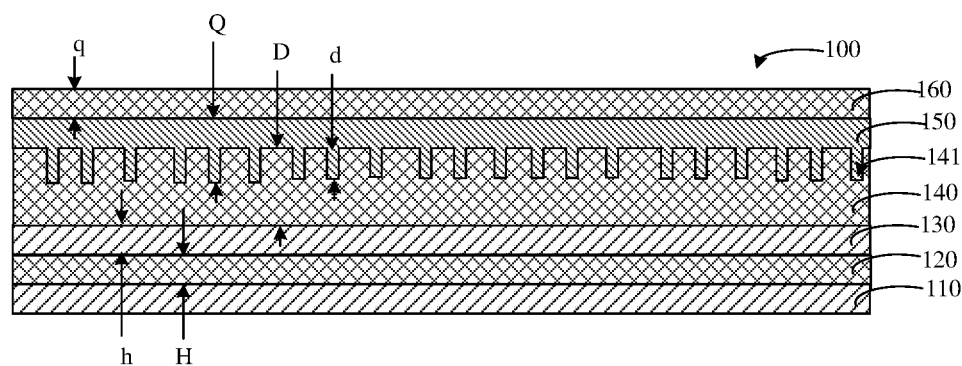

Refer to FIG. 13, a water and oxygen barrier material is sputtered on the second organic insulating layer 150 to form a second barrier layer 160. The water and oxygen barrier material is alumina.

Step B15: forming a transistor layer on the second barrier layer.

Figure 14:
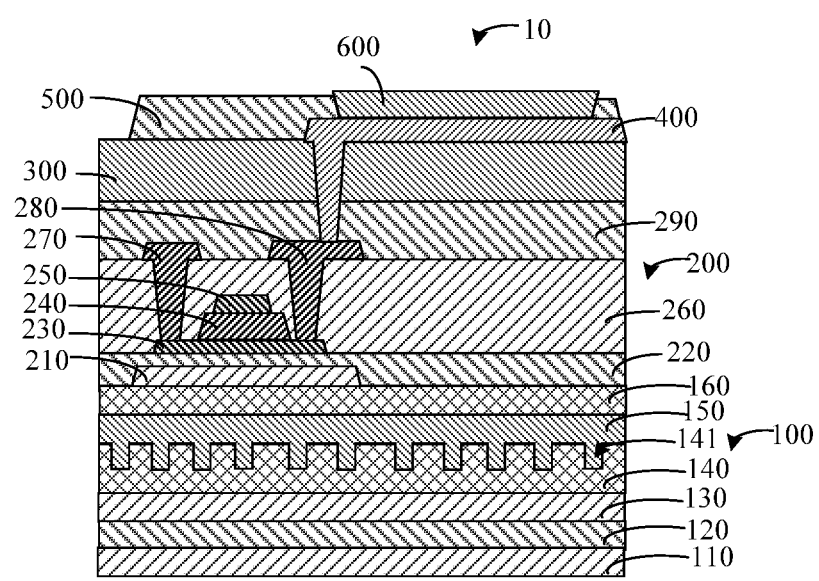

Refer to FIG. 14, sequentially forming the light shielding layer 210, the buffer layer 220, the active layer 230, the gate insulating layer 240, the gate 250, the source and drain electrodes 270 and 280, the interlayer dielectric layer 260, and the passivation layer 290 and the planarization layer 300 of the transistor layer 200 on the second barrier layer 160.

In an embodiment, after the step B15, the fabrication method further comprises:

forming an electrode layer 400 on the planarization layer 300, a pixel defining layer 500 is then formed on the electrode layer 400, a light emitting layer 600 is then formed on the pixel defining layer 500, and the light emitting layer 600 is connected to the electrode layer 400 to complete fabrication of the display panel 10.

In another embodiment, after the fabrication of the display panel 10 is completed, the method further comprises: peeling off the glass substrate 110 and the sacrificial layer 120.

The present application discloses a display panel 10 and a fabrication method thereof. The display panel 10 comprises a flexible substrate 100 and a transistor layer 200. The transistor layer 200 is disposed on the flexible substrate 100, wherein the flexible substrate 100 comprises a first organic insulating layer. 130, a first barrier layer 140, a second organic insulating layer 150, and the second barrier layer 160. The first barrier layer 140 is disposed on the first organic insulating layer 130, and a plurality of grooves 141 are provided on a side of the first barrier layer 140 away from the first organic insulating layer 130. A thickness d of the grooves 141 accounts for 25%-55% of the thickness D of the first barrier layer 140. The second organic insulating layer 150 is provided on the first barrier layer 140 and extends into the grooves 141. In 141, the second barrier layer 160 is disposed on the second organic insulating layer 150. In the present application, grooves 141 are provided on the first barrier layer 140, and a thickness d of the groove 141 is set to account for 25%-55% of a thickness D of the first barrier layer 140 to prevent the problem of cracking occurs during a bending process of the flexible substrate 100, and increase the contact area between the first barrier layer 140 and the second organic insulating layer 150 at the same time, thereby improving the adhesion between the first barrier layer 140 and the second organic insulating layer, thereby avoiding a problem of peeling between the film layers, thereby improving the performance of the display panel 10.

The above is a detailed introduction to a display panel and a fabrication method provided by the embodiments of the present application. Specific examples are used in this article to illustrate the principles and implementations of the present application. The description of the above embodiments is only used to help understand the present application The method of application and its core idea; meanwhile, for those skilled in the art, according to the idea of this application, there will be changes in the specific implementation and the scope of application. In summary, the content of this specification should not be understood as Restrictions on this application.

What is claimed is:

1. A display panel, comprising:
   a flexible substrate; and
   a transistor layer, wherein the transistor layer is disposed on the flexible substrate;
   wherein the flexible substrate comprises:
   a first organic insulating layer;
   a first barrier layer, wherein the first barrier layer is disposed on a side of the first organic insulating layer close to the transistor layer, and a plurality of grooves are provided on a side of the first barrier layer away from the first organic insulating layer, and a thickness of the plurality of grooves accounts for 25%-55% of a thickness of the first barrier layer;
   a second organic insulating layer, wherein the second organic insulating layer is disposed on the side of the first barrier layer away from the first organic insulating layer and extends into the plurality of grooves; and
   a second barrier layer, wherein the second barrier layer is disposed on a side of the second organic insulating layer away from the first barrier layer;
   wherein a surface of the first organic insulating layer close to the first barrier layer and a surface of the first barrier layer close to the first organic insulating layer are in contact with each other and both are flat surfaces.

2. The display panel according to claim 1, wherein the first barrier layer is provided with a center region and edge regions provided on both sides of the center region, and a density of the grooves in the center region is greater than a density of the grooves located in the edge regions.

3. The display panel of claim 2, wherein a groove diameter of the grooves in the center region is smaller than a groove diameter of the grooves located in the edge region.

4. The display panel according to claim 1, wherein each of the grooves comprises a first groove diameter and a second groove diameter that are arranged oppositely, and the first groove diameter is located on a side of the grooves near the first organic insulating layer, the second groove diameter is located on a side of the groove away from the first organic insulating layer, and the first groove diameter is larger than the second groove diameter.

5. The display panel of claim 1, wherein at least one of the first barrier layer and the second barrier layer is made of a water and oxygen barrier material, and the water and oxygen barrier material comprises alumina.

6. The display panel of claim 1, wherein the plurality of grooves are disposed on the first barrier layer in an array.

7. The display panel of claim 1, wherein the plurality of grooves extend in a first direction, and the plurality of grooves are arranged in a second direction, and each of the plurality of grooves comprises a first sub-groove and a second sub-groove, the first sub groove extends in a third direction, the second sub-groove extends in a fourth direction, an end of the first sub-groove is connected to an end of the second sub-groove, and the fourth direction, the third direction and the second direction intersect with the first direction.

8. The display panel of claim 1, wherein the plurality of grooves comprise a first groove and a second groove, the first groove extends along a first direction, and the second groove extends along a second direction, and the first direction intersects the second direction.

9. The display panel of claim 1, wherein the transistor layer comprises a light shielding layer, a buffer layer, an active layer, a gate insulating layer, a gate electrode, a source and drain electrode, an interlayer dielectric layer, a passivation layer, and a planarization layer, the light-shielding layer is disposed on the second barrier layer, the buffer layer covers the light-shielding layer and the second barrier layer, the active layer is disposed on the buffer layer and is located on the light-shielding layer, the gate insulating layer is disposed on the active layer, the gate is disposed on the gate insulating layer, and the interlayer dielectric layer covers the buffer layer and the active layer, the source layer, the gate insulating layer and the gate, the source and drain are disposed on the interlayer dielectric layer and connected to a conductor part of the active layer, and the passivation layer covers the source and drain electrode and the interlayer dielectric layer, and the planarization layer is disposed on the passivation layer.

10. A fabrication method of a display panel, comprising:
    providing a first organic insulating layer;
    forming a water and oxygen barrier material on the first organic insulating layer, the barrier material is patterned to form a first barrier layer, a plurality of grooves are provided on a side of the first barrier layer away from the first organic insulating layer, and a thickness of fabrication method accounts for 25%-55% of a thickness of the first barrier layer;
    forming a second organic insulating layer on the side of the first barrier layer away from the first organic insulating layer, wherein the second organic insulating layer extends into the plurality of grooves;

disposing a water and oxygen barrier material on a side of the second organic insulating layer away from the first barrier layer to form a second barrier layer; and forming a transistor layer on a side of the second barrier layer away from the second organic insulating layer;

wherein a surface of the first organic insulating layer close to the first barrier layer and a surface of the first barrier layer close to the first organic insulating layer are in contact with each other and both are flat surfaces.

11. The fabrication method of a display panel according to claim 10, wherein the first barrier layer is provided with a center region and edge regions arranged on both sides of the center region, and a density of the grooves in the center region is greater than a density of the grooves located in the edge regions.

12. The fabrication method of a display panel according to claim 11, wherein the groove diameter of the groove located in the center region is smaller than the groove diameter of the groove located in the edge regions.

13. The fabrication method of a display panel according to claim 10, wherein before providing the first organic insulating layer, further comprising:

providing a glass substrate, and forming a sacrificial layer on the glass substrate.

14. The fabrication method of a display panel according to claim 10, wherein after forming a transistor layer on the second barrier layer, further comprising:

forming an electrode layer on the planarization layer;
forming a pixel definition layer on the electrode layer; and
forming a light-emitting layer on the pixel defining layer, and the light-emitting layer is connected to the electrode layer.

15. The fabrication method of a display panel according to claim 10, wherein the water and oxygen barrier material comprises alumina.

16. The fabrication method of a display panel according to claim 10, wherein each of the grooves comprises a first groove diameter and a second groove diameter that are arranged oppositely, and the first groove diameter is located on the side of the groove near the first organic insulating layer, the second groove diameter is located on a side of the groove away from the first organic insulating layer, and the first groove diameter is larger than the second groove diameter.

17. The fabrication method of a display panel according to claim 10, wherein the grooves is disposed on the first barrier layer in an array.

18. The fabrication method of a display panel according to claim 10, wherein the plurality of grooves extend in a first direction, and the plurality of grooves are arranged in a second direction, and each of the plurality of grooves comprises a first sub-groove and a second sub-groove, the first sub groove extends in a third direction, the second sub-groove extends in a fourth direction, an end of the first sub-groove is connected to an end of the second sub-groove, and the fourth direction, the third direction and the second direction intersect with the first direction.

19. The fabrication method of a display panel according to claim 10, wherein the plurality of grooves comprise a first groove and a second groove, the first groove extends along a first direction, and the second groove extends along a second direction, and the first direction intersects the second direction.

20. A display panel, comprising:
a flexible substrate; and
a transistor layer, wherein the transistor layer is disposed on the flexible substrate;
wherein the flexible substrate comprises:
a first organic insulating layer;
a first barrier layer, wherein the first barrier layer is disposed on a side of the first organic insulating layer close to the transistor layer, and a plurality of grooves are provided on a side of the first barrier layer away from the first organic insulating layer, and a thickness of the plurality of grooves accounts for 25%-55% of a thickness of the first barrier layer;
a second organic insulating layer, wherein the second organic insulating layer is disposed on the side of the first barrier layer away from the first organic insulating layer and extends into the plurality of grooves; and
a second barrier layer, wherein the second barrier layer is disposed on a side of the second organic insulating layer away from the first barrier layer;
wherein a material of the first barrier layer comprises silicon nitride and/or silicon oxide, and a material of the second barrier layer comprises alumina.

* * * * *